United States Patent [19]

Bischer, Jr. et al.

[11] Patent Number: 5,395,662
[45] Date of Patent: Mar. 7, 1995

[54] IMPROVEMENTS IN HIGH REFLECTIVE ALUMINUM SHEETING AND METHODS FOR MAKING SAME

[75] Inventors: Carmen B. Bischer, Jr., Hayward; Edward A. Small, Jr., Santa Rosa, both of Calif.

[73] Assignee: Dielectric Coating Industries, Hayward, Calif.

[21] Appl. No.: 58,642

[22] Filed: May 5, 1993

Related U.S. Application Data

[63] Continuation-in-part of Ser. No. 919,768, Jul. 24, 1992, Pat. No. 5,312,647.

[51] Int. Cl.$^6$ ........................ B05D 3/06; C23C 16/00
[52] U.S. Cl. .................................. 427/534; 427/539; 427/255.3; 427/255.5
[58] Field of Search ................ 427/534, 535, 539, 251, 427/255.3, 255.5, 567, 593

[56] References Cited

U.S. PATENT DOCUMENTS

| | | | |
|---|---|---|---|
| 2,443,196 | 6/1948 | Raines et al. | 427/593 |
| 2,812,270 | 11/1957 | Alexander | 427/251 |
| 2,952,569 | 9/1960 | Baer et al. | 427/251 |
| 2,996,410 | 8/1961 | Hnilicka, Jr. | 427/251 |
| 3,594,238 | 7/1971 | Hoeckelman | 427/251 |
| 4,430,366 | 2/1984 | Crawford et al. | 427/593 |
| 4,475,794 | 10/1984 | Baker et al. | 427/534 |
| 5,062,900 | 11/1991 | Berneron et al. | 427/535 |
| 5,135,775 | 8/1992 | Foller et al. | 427/535 |
| 5,232,747 | 8/1993 | Evans, Jr. | 427/539 |
| 5,312,647 | 5/1994 | Bisher, Jr. et al. | 427/255.5 |

*Primary Examiner*—Marianne Padgett

[57] ABSTRACT

Improvements in the method and apparatus of vacuum deposition of a highly reflective surface onto aluminum base, including unanodized roll-polished aluminum, wherein a coil of the aluminum is disposed within the vacuum chamber, both as it unwinds and as it rewinds, and the water vapor created by heating the aluminum web is made available to other vacuum deposition processing compartments within the vacuum chamber including a glow discharge chamber typically fueled by argon gas. A relatively thick layer of oxide is vacuum deposited onto an unanodized aluminum base as a substrate for the reflective surface.

17 Claims, 1 Drawing Sheet

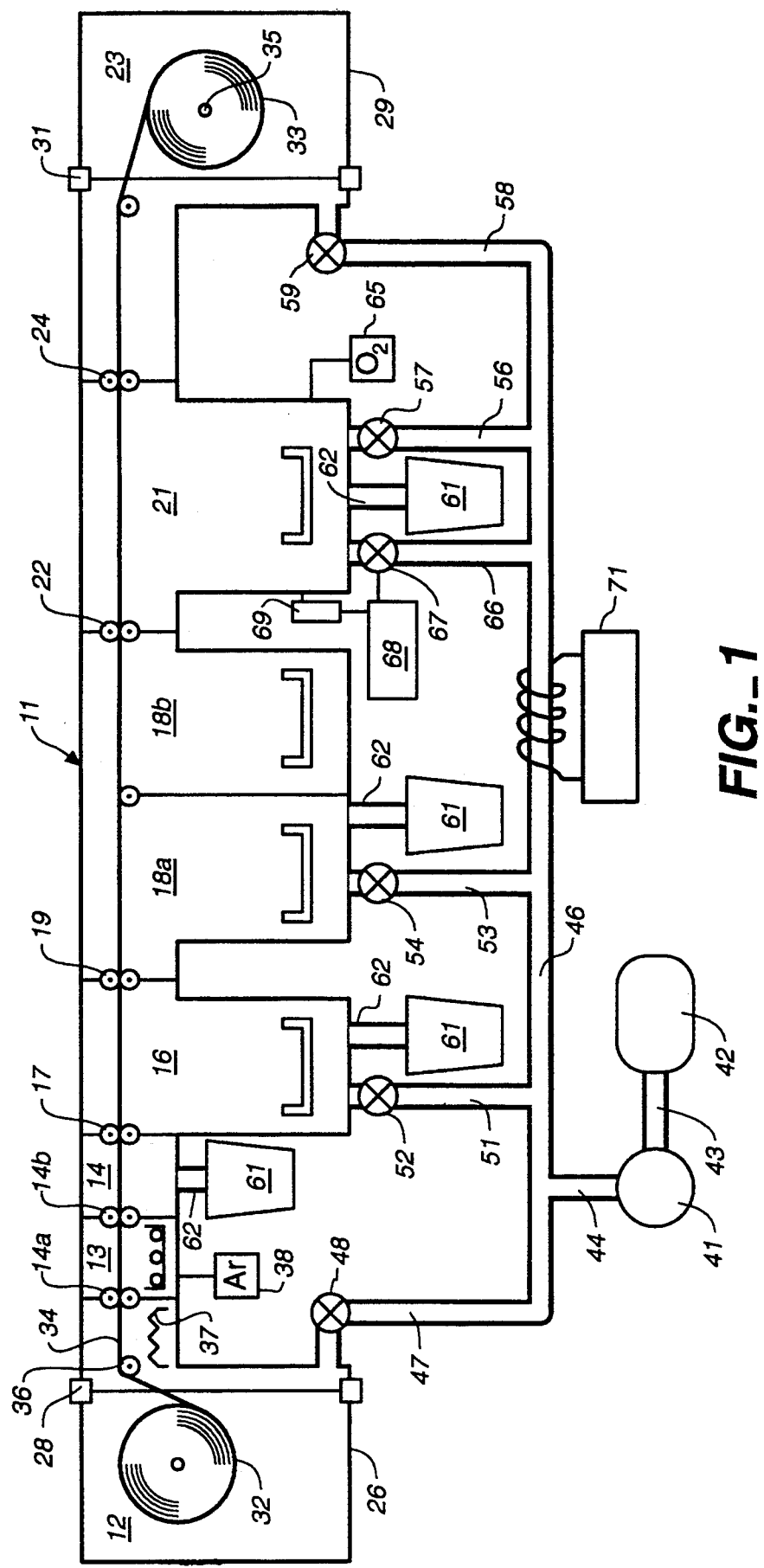
FIG._1

IMPROVEMENTS IN HIGH REFLECTIVE ALUMINUM SHEETING AND METHODS FOR MAKING SAME

This is a continuation-in-part of patent application Ser. No. 07/919,768, filed Jul. 24, 1992, now U.S. Pat. No. 5,312,647, for IMPROVEMENTS IN THE METHOD AND APPARATUS OF VACCUM DEPOSITION.

BACKGROUND OF THE INVENTION

The present invention relates to improvements in methods and apparatus for the vacuum deposition of a coating of material onto aluminum webbing, and in particular to the deposition of such a coating onto a moving web as the web moves from an unwinding coil to a winding coil. The invention is particularly suited, and will be described with reference to, the deposition of a high reflective surface onto an aluminum web.

The basic method for the vacuum deposition of a high reflective surface onto an aluminum web has been practiced for many years and is thus well known in the art. This well known method has been practiced, however, only on webbing in the form of individual sheets of glass or aluminum, typically 40 inches wide, 0.020 inches thick and 50 inches long, weighing approximately four pounds. In the present invention, a coil of aluminum typically 40 inches wide, 0.020 inches thick and from 1000 to 1500 feet long, weighing 900 to 1400 pounds or more is unwound from an unwinding coil onto a winding coil and the high reflective coating is vacuum deposited onto the traveling web in stages as the web travels between the unwinding coil to the winding coil.

The method of the present invention, like that of the prior art, is effective to transform a web of polished anodized aluminum (called lighting sheet) having a reflectivity of about 85% into lighting sheet having a reflectivity of about 95%. This increase in reflectivity can be significant when, for example, the sheet is used for reflectors for increasing the light output from lighting fixtures.

The basic, known method of transforming lighting sheet to reflectors includes the following steps. A sheet of aluminum is inserted into a vacuum chamber which is subdivided into series of internal vacuum compartments which are separated by seals that permit each compartment to be at the particular pressure suitable for the process being performed within that compartment. The aluminum sheet is transported from one compartment to another to permit whatever process is being performed in that compartment to be applied to the sheet.

In the first compartment the aluminum sheet is exposed to heat to drive out water.

In the next compartment the sheet is exposed to a glow discharge, typically maintained by argon gas, to drive out any remaining water and for further heating to facilitate adhesion.

Next the sheet is placed into a compartment where a thin oxide layer is applied to increase adhesion and seal the anodized (aluminum dioxide) layer which covers the polished aluminum sheet stock.

In the next compartment, an opaque layer of aluminum is deposited onto the web. In the following compartments the classical reflectance-enhancing layers of a quarter wave length of low index of refraction material then a quarter wave length of a high index of refraction material are deposited. The high index of refraction material is of the kind deposited in an atmosphere of a partial pressure of oxygen and a partial pressure of water vapor. Each coating is applied in a vacuum compartment to which the sheet is transported after the preceding coating has been applied.

The present invention improves the method and apparatus for applying a high reflectance coating to an aluminum web by using a continuously moving web from a coil of aluminum, by using water vapor (such as that created by heating the web) to fuel the glow discharge, and by using water vapor (such as that created by heating the web) to stabilize the pressure and background atmosphere in the compartment where the high index layer is applied.

Additionally, the present invention teaches the use of unanodized roll-polished aluminum as a web material in place of anodized aluminum to improve the reflector's durability and reduce the cost.

BRIEF DESCRIPTION OF THE INVENTION

The improvements of the present invention are to the methods and apparatus described above for vacuum deposition of coatings onto aluminum and in particular to high reflective coatings onto an aluminum web.

In the present invention, a coil of aluminum (which can be of the typical dimensions mentioned above) is mounted within a vacuum chamber in its own separate low pressure compartment and unwound onto a take-up coil also in its own separate low pressure compartment within the vacuum chamber. Between the unwinding coil compartment and the winding coil compartment are several compartments where the deposition process described above takes place. Thus, unlike the prior art, where separate sheets of material are transported to the various compartments within the chamber to be processed, in the present invention a web of aluminum is continuously moving through the process compartments as it is transported from the unwinding coil to the winding coil. The web moves comfortably at the rate of about five feet per minute with higher speeds possible.

Because the present invention contemplates the deposition of a multiple coat finish onto a long web of substrate, the process necessarily continues over a considerable length of time. In order to achieve a consistent output without having to stop the web and make adjustments (and thereby reduce productivity), stability of the various processes taking place within the chamber 11 becomes a serious consideration. This is particularly critical in the high index deposition compartment. In the present invention a source of stabilizing atmosphere is created from the water vapor by-product of the unwinding compartment.

The aluminum web coming off of the coil in the low pressure unwinding compartment is heated to drive off water. This heating of the web creates a continuous supply of water vapor within the unwinding compartment. This water vapor (or another source of water vapor) is used to stabilize the required pressure and background atmosphere in the high index deposition compartment.

The use of argon gas to fuel the glow discharge is expensive. One attempt to reduce the amount of argon gas used to maintain a glow discharge can be found in U.S. Pat. No. 3,868,271, issued Feb. 25, 1975 to Poley and Whitaker. In their invention, gas is pumped through water to add water vapor to the atmosphere of the glow discharge. The patent does not teach, however, or suggest that an atmosphere of water vapor alone could be used to maintain a glow discharge. In the present invention water vapor (such as that from the unwinding compartment) is used as the only fuel for maintaining the glow discharge after the glow discharge has been initiated with argon gas.

Another important aspect of the invention is found in the aluminum base material used as the substrate. Unlike the prior art that uses an aluminum base that has been anodized for protection, in the present invention the base material is unanodized aluminum to which is applied a layer of oxide (such as $SiO_2$). This oxide layer is thick relative to oxide layers applied over anodized aluminum but is considerably thinner than the typical anodize layer regularly found on lighting sheet. By substituting the silica layer for the anodization the resulting reflective material is both less expensive to produce and more durable.

It is an object of the present invention to provide improvements in vacuum deposition equipment whereby the deposition process can be applied to a continuously moving web of aluminum as it travels from an unwinding coil to a winding coil.

It is another object of the present invention to provide improvements in vacuum deposition equipment whereby a coil of aluminum is disposed in a low pressure compartment where water in the coil is heated into water vapor which is made available to the glow discharge compartment to feed the glow discharge.

It is yet another object of the invention to fuel the glow chamber in a vacuum deposition process for adding a high reflectivity surface to a substrate with water vapor instead of argon gas or the like.

It is a further object of the present invention to provide improvements in vacuum deposition equipment whereby a coil of aluminum is disposed in a low pressure compartment where water in the coil is heated into water vapor which is made available to the high index deposition compartment.

Another object of the present invention is to provide improvements in vacuum deposition methods whereby the deposition process can be applied to a continuously moving web of aluminum.

It is yet another object of the present invention to provide improvements in vacuum deposition methods including disposing a coil of aluminum in a low pressure compartment and unwinding the coil onto a take-up coil in a separate low pressure compartment.

Still another object of the present invention is to provide improvements in vacuum deposition methods including disposing a coil of aluminum in a low pressure compartment and driving the water from the coil in the form of water vapor which is made available to a glow discharge compartment.

An additional object of the present invention is to provide improvements in vacuum deposition methods including disposing a coil of aluminum in a low pressure compartment and driving the water from the coil in the form of water vapor which is made available to a high index deposition compartment to maintain stability.

Another object of the present invention is to provide improvements in vacuum deposition methods by using a web of unanodized aluminum and applying a layer of silica as the base protective material.

Other objects of the present invention will in part be obvious and will in part appear hereafter.

BRIEF DESCRIPTION OF THE DRAWINGS

FIG. 1 is a schematic diagram of vacuum deposition equipment useful in connection with the improvements of the present invention.

DESCRIPTION OF PREFERRED EMBODIMENT

Referring to FIG. 1, a vacuum chamber 11 is subdivided into a number of low pressure vacuum compartments where the vacuum deposition process takes place. An unwinding compartment 12 is separated from a glow discharge compartment 13 by a rolling seal 14a. Glow discharge compartment 13 is separated from a pressure differential compartment 14 by a rolling seal 14b, while the pressure differential compartment is separated from an adhesion deposition compartment 16 by rolling seal 17. A compartment 18 is subdivided into sections 18a and 18b for the application of an aluminum layer and a low index layer and is separated from the adhesion compartment by rolling seals 19, while compartment 18 is separated from a high index deposition compartment 21 by rolling seals 22. Finally, a winding compartment 23 is separated from the high index compartment by rolling seals 24.

The rolling seals 14a, 14b, 17, 19, 22, and 24, are all of a type well known in the art for maintaining pressure separation between adjacent vacuum compartments even while allowing material to pass between them. Thus, the construction of the seals does not form any part of the invention per se. It is however, a characteristic of these seals that in being required to continuously pass a moving web they necessarily permit some leakage. The operation of vacuum pumps, as more fully described below, keeps each compartment at its required pressure even though there is some migration across the seals.

Compartment 12 is formed at one end 26 of the vacuum chamber 11 and can be opened at pressure seal 28. Compartment 23 is formed at the other end 29 of vacuum chamber 11 and can be opened at pressure seal 31. In this way, compartment 12 can be opened to receive and hold a coil of aluminum 32 in vacuum chamber 11 for deposition of a coating of high reflective material. And compartment 23 can be opened to permit a coil 33 of finished material to be removed from the chamber 11.

The apparatus performs the deposition process as follows. A coil 32 of aluminum (either anodized lighting sheet or unanodized polished aluminum as described below) is loaded into compartment 12 and the web 34 fed through the various rolling seals to take-up coil 33. The take-up coil is mounted on a spindle 35 that is driven clockwise by an appropriate power train (not shown) to coil the processed web and provide a drive for unwinding the web from coil 32 and transporting it through the various process compartments. The chamber 11 is sealed closed and pumped to a low pressure by well known means such as a rotary pump 41 and a mechanical pump 42 which are connected in series through pressure line 43. The pumps 41 and 42 are connected through a feed line 44 to a main pump line 46 which connects to the individual compartments within chamber 11, except for the glow discharge compartment 13 and pressure differential compartment 14. Pump line 46 connects to the unwinding compartment 12 through line 47 and valve 48; to the adhesion compartment 16 through line 51 and valve 52; to the aluminum and low index compartment 18 through line 53 and valve 54; to the high index compartment 21 through line 56 and valve 57; and, to the winding compartment 23 through line 58 and valve 59.

After the pumps 41 and 42 lower the pressure in the compartments within their range of capability, the valves 48, 52, 54, 57 and 59 are closed and compartments 14, 16, 18 and 21 are pumped to yet a lower pressure by cryogenic pumps 61 operatively associated with each of those compartments through lines 62.

The various pressures required to be maintained in each compartment is well known in the art and readily achievable with well known apparatus. By way of example only, the working pressure in the unwinding compartment 12 and the winding compartment 23 may be 40 microns while that in the glow discharge compartment 13 is 20 to 30 microns. The pressure in the glow discharge compartment is established without pumping that compartment directly. Rather the pressure in compartment 13 is set by establishing a pressure in compartment 14 that is higher than the pressure in compartment 16 (but lower than the pressure in compartment 12) in an amount that sets up a pressure gradient across seals 14a and 14b that establishes the requisite pressure in compartment 13. Because compartment 16 is maintained at a very low pressure, differential pressure chamber 14 is formed by two seals 14b and 17 and pumped by its associated pump 61 to a pressure that establishes the correct gradient between seals 14a and 14b to set the pressure in compartment 13 at the required level.

The adhesion compartment 16 is pumped to $10^{-4}$ torr, the aluminum and low index compartment 18 is pumped to $2 \times 10^{-5}$ torr, and the high index compartment 21 is pumped to $6 \times 10^{-5}$ torr.

As the aluminum web 34 is transported from coil 32 in unwinding compartment 12 to coil 33 in winding compartment 33 it passes through, and is guided by, the various rolling seals that separate the various internal compartments within chamber 11. In these compartments the moving web is subjected to the process taking place in that compartment, eventually leading to a web with a high reflective coating.

As the web leaves the coil 32 it is fed over a guide roller 36 and into rolling seals 14a and 14b. Within compartment 12 and between the coil 32 and the seal 14a the web 34 is heated by a heater 37 to drive out water carried in the aluminum, creating water vapor within compartment 12. Because the pressure in unwinding compartment 12 is higher than the pressure in glow chamber 13, the water vapor migrates across the seal 14a into compartment 13 where it is used to maintain the glow discharge initiated by the use of argon gas from a gas supply source 38. The use of water vapor alone to maintain a glow discharge initiated by argon is taught for the first time by the present invention. When the argon gas is discontinued altogether the combination of the water vapor from chamber 12 (or an alternate independent source) and the additional water vapor created by the glow discharge bombardment of the web, will maintain the glow by itself, at a much reduced cost.

The water vapor in compartment 12 can also be used in high index compartment 21 to stabilize the required pressure and background atmosphere therein to properly carry out the deposition of high index material over a significant period of time.

The high index deposition process starts out in an atmosphere of oxygen and water vapor. As the process progresses, oxygen is consumed and resupplied at a constant rate from oxygen supply 65. The initial water vapor is also consumed in the process with an attendant drop in pressure in compartment 21. In prior art methods and apparatus where the duration of the process is relatively short, this loss of water vapor is compensated for by increasing the flow of oxygen into the compartment. For long duration processes, however, as contemplated by the present invention, oxygen alone cannot adequately stabilize the process.

Thus, in the present invention, water vapor is made available to compartment 21 to augment the water vapor taken from the walls of the compartment in the deposition process. A convenient source of that water vapor is compartment 12, although an independent source could be used. A feed line 66 off of main pump line 46 connects through a valve 67 to compartment 21. By opening valve 48 at compartment 12, water vapor from that compartment is available to compartment 21 whenever valve 67 is open. A valve control means 68 receives a signal from pressure sensor 69 which senses the pressure in compartment 21. The control means (which can be any one of several well know devices for controlling valve operation) is adjusted to have a set point pressure at which it opens valve 67 and a set point at which it closes the valve. When the pressure in compartment 21 varies from the set point pressure by a pre-set amount, that condition is sensed by sensor 69 and control means 68 causes valve 67 to open to permit water vapor into the chamber to re-establish the required pressure and resupply water vapor leached from the walls of the compartment in the deposition process. When the desired conditions have been re-established, sensor 69 sends a signal to control means 68 and the valve 67 closes cutting off the flow of water vapor.

A heater 71 is operatively associated with the main pressure line 46 to keep the water vapor in line 46 from condensing as it travels from compartment 12 to compartment 21.

The interjection of water vapor into glow discharge chamber 13 is facilitated in the preferred embodiment across the rolling seal 14a by the force of an established pressure gradient. The same result can be achieved by the use of an arrangement of parts substantially identical to that described with reference to the interjection of water vapor into compartment 21. In that case a separate line from compartment 12 to compartment 13 through appropriate valving would permit the metering of water vapor to compartment 13 as needed to sustain the glow discharge therein.

If a high reflectance finish is vacuum deposited onto a polished aluminum base which has not otherwise been treated, the resulting material will scratch or sleek so severely when cleaned as to significantly reduce its reflectance. It has long been known that a cleanable surface can be created by anodizing the polished aluminum prior to the vacuum deposition process.

Because the chemical process of anodizing aluminum is costly, it is of considerable advantage in producing high reflectance aluminum if a substrate of simple polished aluminum can be used rather than anodized aluminum. In the present invention, the aluminum substrate is not anodized and the surprising result is a product with equal or superior scratch resistance and superior weathering characteristics.

Lighting sheet, typically used as a substrate for high reflectivity reflectors, is a commercial product used in many light fixtures. Being anodized it has a hard enough finish to permit cleaning without undue finish degradation. The anodization, however, makes it an expensive substrate for high reflectance reflectors. The present invention teaches that the modification of one step in the process of adding a high reflectance finish to lighting sheet can eliminate the need for the web substrate to be anodized.

A typical step in the process of producing a high reflectance material is the vacuum deposition of a thin layer of oxide (usually silica) onto the web prior to deposition of the high reflectance materials.

Whereas the typical layer of oxide applied to an anodized aluminum substrate prior to applying high reflectance layers is 0.001 microns, in the present invention 0.5 to 2.0 microns of oxide such as silica ($SiO_2$) is applied to an unanodized roll-polished aluminum substrate. After the remaining layers are deposited onto the web, the resulting high reflectance material has all of the qualities of one having an anodized substrate, and with superior weathering and scratch resistance. All at a lower cost. Thus, by substantially increasing the thickness of oxide applied to the substrate as a base for the high reflectance materials, the need for anodized aluminum as a substrate is eliminated along with the cost of anodization.

The resulting high reflectance material compares to the more expensive anodized-base materials in the following ways: equivalent or better abrasion resistance; superior weatherability (resistance to humidity); superior workability (can be formed with fewer microcracks); compatible with high reflectance vacuum deposition process; and significantly lower cost.

The invention having been fully described, it is not to be limited to the details herein set forth, but is of the full scope of the appended claims.

We claim:

1. In a process for vacuum depositing of a reflective finish onto an aluminum substrate the step of:
   vacuum depositing a layer of oxide equal to or greater than 0.50 microns in thickness onto the substrate.

2. The process of claim 1 the oxide layer is 0.50 to 2.0 microns thick.

3. The process of claim 1 wherein the oxide is $SiO_2$.

4. The process of claim 2 wherein the oxide is $SiO_2$.

5. In a process for forming a reflective finish onto a base of aluminum that has not been anodized the steps of:
   subjecting the base to a glow discharge;
   vacuum depositing onto the base a layer of oxide having a thickness of 0.50 microns or more; and
   vacuum depositing over the oxide layer a layer of reflectance material.

6. The process of claim 5 wherein the oxide layer is between 0.50 and 2.0 microns thick.

7. The process of claim 5 wherein the oxide is $SiO_2$.

8. The process of claim 6 wherein the oxide is $SiO_2$.

9. The process of claim 5 wherein the glow discharge is fueled by water vapor.

10. The process of claim 9 further comprising the step of:
    subjecting the base to heat under vacuum to drive off water vapor; wherein the water vapor fueling the glow discharge is that driven off of the base.

11. In a process for vacuum depositing a reflectance finish onto a continuously moving substrate of unanodized aluminum wherein the aluminum substrate is a roll of aluminum and the process takes place in a vacuum chamber which includes the roll of aluminum and through which the substrate travels as it is unrolled from the roll, the improvement comprising:
    vacuum depositing a layer of oxide equal to or greater than 0.50 microns in thickness onto the moving substrate prior to the reflectance finish being vacuum deposited onto the substrate.

12. The process of claim 11 wherein the oxide layer is 0.50 to 2.0 microns thick.

13. The process of claim 11 wherein the oxide is $SiO_2$.

14. The process of claim 12 wherein the oxide is $SiO_2$.

15. The process of claim 11 further comprising the steps of:
    subjecting the substrate to a glow discharge in a glow discharge chamber prior to the deposition of the oxide layer.

16. The process of claim 15 wherein the glow discharge is fueled by water vapor.

17. The process of claim 16 further comprising the steps of:
    subjecting the substrate to heat under vacuum to drive off water vapor prior to the deposition of the oxide layer; and
    directing the water vapor driven off of the substrate when heated under vacuum to the glow discharge chamber as fuel for the glow discharge.

* * * * *